United States Patent [19]
Park et al.

[11] Patent Number: 5,477,497
[45] Date of Patent: Dec. 19, 1995

[54] SEMICONDUCTOR MEMORY DEVICE

[75] Inventors: Hee-choul Park, Kyungki; Chul-min Jung, Seoul, both of Rep. of Korea

[73] Assignee: Samsung Electronics Co., Ltd., Suwon, Rep. of Korea

[21] Appl. No.: 273,745

[22] Filed: Jul. 12, 1994

[30] Foreign Application Priority Data

Jul. 12, 1993 [KR] Rep. of Korea .................. 93.13091

[51] Int. Cl.$^6$ .................. G11C 7/06; H03K 5/22
[52] U.S. Cl. .................. 365/205; 365/207; 365/208; 327/51
[58] Field of Search .................. 365/154, 205, 365/206, 207, 208; 307/530, 355

[56] References Cited

U.S. PATENT DOCUMENTS

| | | | |
|---|---|---|---|
| 3,678,473 | 7/1972 | Wahlstrom | 365/205 |
| 3,978,459 | 8/1976 | Koo | 365/206 |
| 4,070,590 | 1/1978 | Ieda et al. | 315/205 |
| 4,578,781 | 3/1986 | Ogawa et al. | 365/205 X |
| 5,036,231 | 7/1991 | Kanbara | 365/205 |
| 5,097,157 | 3/1992 | Jaffe et al. | 307/530 |
| 5,241,504 | 8/1993 | Seevinck | 365/205 |

*Primary Examiner*—David C. Nelms
*Assistant Examiner*—Son Dinh
*Attorney, Agent, or Firm*—Robert A. Westerlund; Stephen R. Whitt; Charles R. Donohoe

[57] ABSTRACT

A semiconductor memory device which includes, in a first embodiment, a first PMOS transistor having a source electrode coupled to a signal transport line, a second PMOS transistor having a source electrode coupled to an inverted signal transport line, a drain electrode coupled to a gate electrode of the first PMOS transistor, and a gate electrode coupled to a drain electrode of the first PMOS transistor, a first current limiter connected between the drain electrode of the first PMOS transistor and a reference potential, a second current limiter connected between the drain electrode of the second PMOS transistor and the reference potential, a first constant current source connected between a supply voltage and the source electrode of the first PMOS transistor, and, a second constant current source connected between the supply voltage and the source electrode of the second PMOS transistor.

28 Claims, 9 Drawing Sheets

SEMICONDUCTOR MEMORY DEVICE

BACKGROUND OF THE INVENTION

The present invention relates generally to semiconductor memory devices, and, more particularly, to a semiconductor memory device which is capable of a higher speed of operation than presently available semiconductor memory devices.

As the integration density and memory capacity of semiconductor memory devices has increased, chip size has increased, and consequently, the interconnect lines for transporting data read from a selected memory cell thereof have become commensurately longer, all of which has ultimately caused delays in memory read operations. The net upshot is that the speed of operation of semiconductor memory devices has become increasingly limited by the signal delays over long interconnect lines having large voltage swings.

There has been widespread and extensive investigation throughout the semiconductor industry into the nature of the above-identified signal delay problem, and into the potential solutions to such signal delay problem. The following is a summary of the relevant findings that have been made thus far.

The signal delay is largely the result of large capacitive loads present along the long signal-transporting or interconnect lines which undergo large voltage swings. Using extended, e.g., multistage, line drivers helps to reduce such signal delay to some extent, but also creates problems with respect to the driver inputs. Moreover, multistage drivers increase power consumption and can actually lead to additional signal delays. Further, it is not feasible to use line drivers between the memory cells and bit lines of a semiconductor memory device.

Such signal delays due to long interconnect lines are being studied in terms of both voltage-mode and current-mode data signals. It has been observed that major speed improvements are achievable when current-mode data signals are used. The signal delay phenomenon for each type of signal mode will be described below, with the delay signal delay phenomenon for the voltage-mode signal being explained first.

FIG. 1 is an RC circuit network having an output load resistor $R_L$. The voltage-mode signal delay $\delta t_V$ can be expressed in terms of the following equation (1):

$$\delta t_V = R_T C_T/2(1+2R_B/R_T), \quad (1)$$

where $R_T$ represents the total line resistance, $C_T$ represents the total line capacitance, and $R_B$ represents the internal resistance of the line driver.

From equation (1) it can be seen that when $R_B$ is greater than $R_T$ in a CMOS circuit, the signal delay will be considerably larger than the intrinsic line delay ($R_T C_T/2$). It can also be seen from equation (1) that the total line resistance $R_T$ has only a minor influence on the signal delay as long as $R_T$ is much greater than $2R_B$.

With continuing reference to FIG. 1, the current-mode signal delay will now be explained. It is assumed that the output of the signal-transport line is connected to a signal receiver having a low input resistance, thereby resulting in a low load resistance $R_L$. The output signal is the current $I_0$ flowing through the virtual short-circuit $R_L$. This current signal is transferred to data output circuitry by a current-signal receiver.

Assuming an ideal virtual short circuit, i.e., $R_L=0$, the ideal current-mode signal delay $\delta t_i$ can be expressed in terms of the following equation (2):

$$\delta t_i = R_T C_T/2((R_B+R_T/3)/(R_B+R_T)). \quad (2)$$

In contrast to the voltage-mode signal delay, the current-mode signal delay is approximately equal to the intrinsic line delay. Thus, the current-mode signal delay is much smaller than the voltage-mode signal delay.

However, the data line loads influence the speed of operation of a semiconductor memory device even if it is operated in the current mode.

The data sensing operation of a conventional semiconductor memory device will now be described in conjunction with FIG. 2, which depicts the data sensing circuitry of a conventional semiconductor memory device which is disclosed in Vol. 26, No. 4 of the *IEEE Journal of Solid State Circuits* (April, 1991). With reference to FIG. 2, the conventional data sensing circuitry includes a PMOS transistor P1 whose source electrode is coupoed to a power supply voltage ($V_{DD}$), whose gate electrode is coupled to ground ($V_{SS}$), and whose drain electrode is coupled to a bit line BL, a PMOS transistor P2 whose source electrode is coupled to the power supply voltage, whose gate electrode is grounded, and whose drain electrode is coupled to an inverted bit line BLB, a PMOS transistor P3 whose source electrode is coupled to the bit line BL, a PMOS transistor P4 whose source electrode is coupled to the inverted bit line BLB, whose drain electrode is coupled to the gate electrode of PMOS transistor P3 and whose gate electrode is coupled to the drain electrode of PMOS transistor P3, a PMOS transistor P5 whose source electrode is coupled to the drain electrode of PMOS transistor P3, whose gate electrode is coupled to the gate electrode of PMOS transistor P6 and whose drain electrode is coupled to a data line DL, a PMOS transistor P6 whose gate electrode is coupled to the gate electrode of PMOS transistor P5, whose source electrode is coupled to the drain electrode of PMOS transistor P4 and whose drain electrode is coupled to an inverted data line DLB, an NMOS transistor N1 whose drain and gate electrodes are commonly coupled to the drain electrode of PMOS transistor P6 and whose source electrode is grounded, an NMOS transistor N2 whose gate electrode is coupled to the drain electrode of PMOS transistor P6 and whose source electrode is grounded, a PMOS transistor P7 whose gate and drain electrodes are commonly coupled to the drain electrode of NMOS transistor N2 and whose source electrode is coupled to the power supply voltage, a PMOS transistor P8 whose source electrode is coupled to the power supply voltage and whose gate electrode is coupled to the gate electrode of PMOS transistor P7, an NMOS transistor N3 whose drain electrode is coupled is coupled to the drain electrode of PMOS transistor P8, whose source electrode is grounded and whose gate electrode is coupled to the drain electrode of PMOS transistor P5, an NMOS transistor N4 whose gate and drain electrodes are commonly coupled to the drain electrode of PMOS transistor P5 and whose source electrode is grounded, a PMOS transistor P9 whose source electrode is coupled to the power supply voltage and whose gate electrode is coupled to the drain electrode of PMOS transistor P8, and an NMOS transistor N5 whose gate electrode is coupled to the drain electrode of of NMOS transistor N3, whose drain electrode is coupled to the drain electrode of PMOS transistor P9 and whose source electrode is grounded. A select signal YSEL is applied to the common gate node between PMOS transistors P5 and P6, and the output is taken from the common drain node between PMOS transistor P9 and NMOS transistor N5.

With the above-described configuration, the PMOS transistors P1 and P2 operate as constant current sources, and the PMOS transistors P3, P4, P5 and P6 operate as a first stage sense amplifier. The PMOS transistors P7 and P8 and the NMOS transistors N2 and N3 operate as a second stage sense amplifier. The PMOS transistor P9 and NMOS transistor N5 operate as an output buffer. The four PMOS transistors P3, P4, P5, and P6 constituting the first stage sense amplifier are equal-sized and can fit within the column pitch of the memory device, thereby avoiding the need for a column selection element, and thereby, in turn, reducing signal propagation delay.

The first stage sense amplifier is selected or activated by grounding the select signal YSEL, thereby turning on the transistors P5 and P6, whereby current is drawn through the transistors P3 and P4 via the bit-line loads. The bit-line loads are low ohmic loads to ensure that the bit lines themselves are always close to the power supply voltage level during a read operation.

Since PMOS transistor P1 and P3 are of equal size, the gate-source voltage $V_1$ of the PMOS transistor P3 is equal to that of the PMOS transistor P1, so that the respective currents flowing therethrough are equal, i.e., both transistors are in saturation. The same principle applies to the transistors P2 and P4, whose gate-source voltage is represented as $V_2$.

With the select signal YSEL grounded, the bit line BL and the inverted bit line BLB will both have a voltage of $V_1+V_2$. Therefore, the potential of each bit line will both be equal, independent of the current distribution therebetween. Thus, a virtual short circuit exists across the bit line pair BL, BLB. Also, since the bit line voltages are equal, the bit-line load currents will also be equal, as well as the bit-line capacitor currents.

During a read operation, as the selected memory cell draws current, the right-hand leg of the sense amplifier must pass more current than the left-hand leg of the sense amplifier. The difference between these two currents is equal to the current drawn by the selected memory cell (i.e., cell current). The drain currents of the PMOS transistors P5 and P6 are passed to current transporting data line pair DL, DLB, respectively, and the differential data line current is therefore equal to the cell current. This operation is known as current sensing. The cross-coupled structure of the sense amplifier functions as a flip-flop. To prevent unwanted latching of the sense amplifier, the sense amplifier is configured to have a suitable latching margin. However, this latching margin increases bit-line load resistance, increases semiconductor body effect, and decreases the resistance of the short-channel output transistors of the memory device.

The speed of the sensing operation of the above-described current-mode sense amplifier is unaffected by the bit-line capacitance since no differential capacitor discharging is required to sense the data read out of the selected memory cell. Thus, the speed of operation of the memory device is enhanced. A second speed-enhancing feature is provided by the common-mode discharge current pulse $i_c$ from the bit-line capacitors, effectively precharging the sense amplifier as soon as the select signal YSEL is grounded. This second speed-enhancing feature, which can be considered to be a form of dynamic biasing, increases the speed of operation, but does not increase the current consumption of the memory device. Further, since the bit-line voltages are kept equal, the sense amplifier performs an intrinsic equalizing function, thereby eliminating the need for bit-line equalization during a read cycle.

The output of the above-described current-mode sense amplifier can be in current form, or, alternatively, the differential voltage of nodes A and B can be taken as the output to be further amplified by a second stage differential voltage sense amplifier, in which case, the PMOS transistors P3 and P4 operate to propagate voltage only when the nodes A and B are driven to a high level and a low level, respectively. Therefore, if the parasitic capacitance of the data line pair DL, DLB is large and the signal transporting speed thereof is decreased accordingly, the voltages on the data lines DL and DLB only gradually become equal, thus reducing the speed of operation of the output voltage sense amplifier stage.

To summarize the operation of the circuit depicted in FIG. 2, data is read out from a selected memory cell (during a read operation), with the read-out data being transferred to complementary bit lines of a bit line pair, BL, BLB. In order to increase the speed of the read operation, both lines of the bit line pair are maintained as near to the same potential as possible. Only a difference in currents is realized between the nodes C and D. Assume current I1 is drawn through the node C and current I2 is drawn through the node D. The current I2 can be expressed as I1+ΔI. Assuming a binary "1" is read from the selected memory cell during a read operation, the current I2 becomes larger than the current I1, and the voltage $V_1$ at the node A becomes lower than the voltage $V_2$ at the node B. Also, since the current I2 is larger than the current I1, the current flowing through the NMOS transistor N3 surpasses that flowing through the NMOS transistor N4. Therefore, the gate-source voltage $V_{GS1}$ of the NMOS transistor N3 is greater than the gate-source voltage $V_{GS2}$ of the NMOS transistor N4. The voltages $V_{GS1}$ and $V_{GS2}$ are subsequently applied to the output voltage differential sense amplifier stage.

Therefore, in the conventional semiconductor memory device, PMOS transistors P3 and P4 are cheargded to a "high" level and "low" level, respectively. Then, due to signal delays and the large parasitic capacitances along the data lines DL and DLB (as measured at the nodes E and F), the voltages gradually equalize. Also, as the output voltage of the first stage sense amplifier approaches ground potential, the operational speed of the second (output) stage differential voltage sense amplifier is lowered, thereby limiting the overall operating speed of the semiconductor memory device.

SUMMARY OF THE INVENTION

The present invention encompasses a semiconductor memory device which includes, in a first embodiment, a first PMOS transistor having a source electrode coupled to a signal transport line, a second PMOS transistor having a source electrode coupled to an inverted signal transport line, a drain electrode coupled to a gate electrode of the first PMOS transistor, and a gate electrode coupled to a drain electrode of the first PMOS transistor, a first current limiter connected between the drain electrode of the first PMOS transistor and a reference potential, a second current limiter connected between the drain electrode of the second PMOS transistor and the reference potential, a first constant current source connected between a supply voltage and the source electrode of the first PMOS transistor, and, a second constant current source connected between the supply voltage and the source electrode of the second PMOS transistor.

In a second embodiment, the present invention encompasses a semiconductor memory device which includes a first current limiter coupled to a supply voltage, a second current limiter coupled to the supply voltage, a first NMOS transistor having a drain electrode coupled to the first current limiter, a gate electrode coupled to the second current limiter, and a source electrode coupled to a signal transport line, a second NMOS transistor having a drain electrode coupled to the gate electrode of the first NMOS transistor and to the second current limiter, a gate electrode coupled to the drain electrode of the first NMOS transistor and to the first current limiter, and a source electrode coupled to an inverted signal transport line, a first constant current source connected between the source electrode of the first NMOS transistor and a reference potential, and, a second constant current source connected between the source electrode of the second NMOS transistor and the reference potential.

In other embodiments, the NMOS transistors are replaced with bipolar NPN transistors, and the PMOS transistors are replaced with bipolar PNP transistors.

BRIEF DESCRIPTION OF THE DRAWINGS

These and various other features, aspects, and advantages of the present invention will be readily understood with reference to the following detailed description taken in conjunction with the accompanying drawings, wherein like reference numerals designate like structural elements, and, in which.

DETAILED DESCRIPTION OF THE INVENTION

Figure 1:
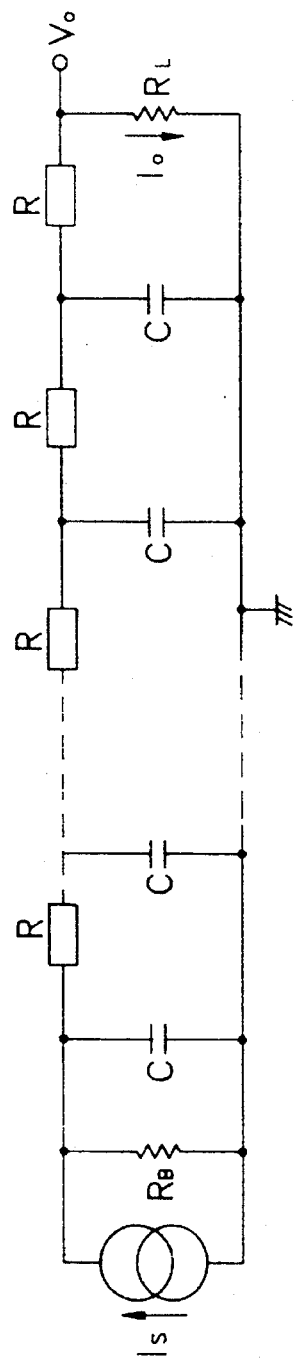
FIG. 1 is a circuit diagram utilized for the purpose of explaining the signal delays caused by data line loads.
Figure 2:
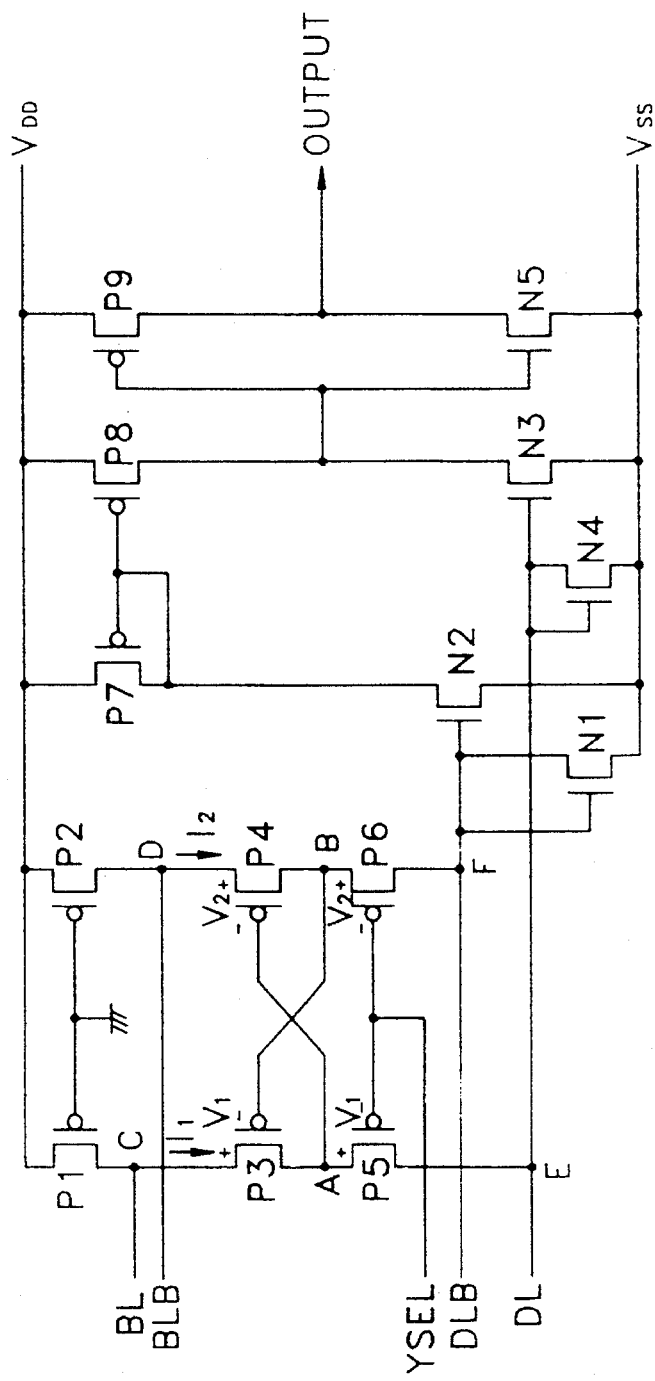
FIG. 2 is a circuit diagram of the data sensing portion of a conventional semiconductor memory device.
Figure 3:
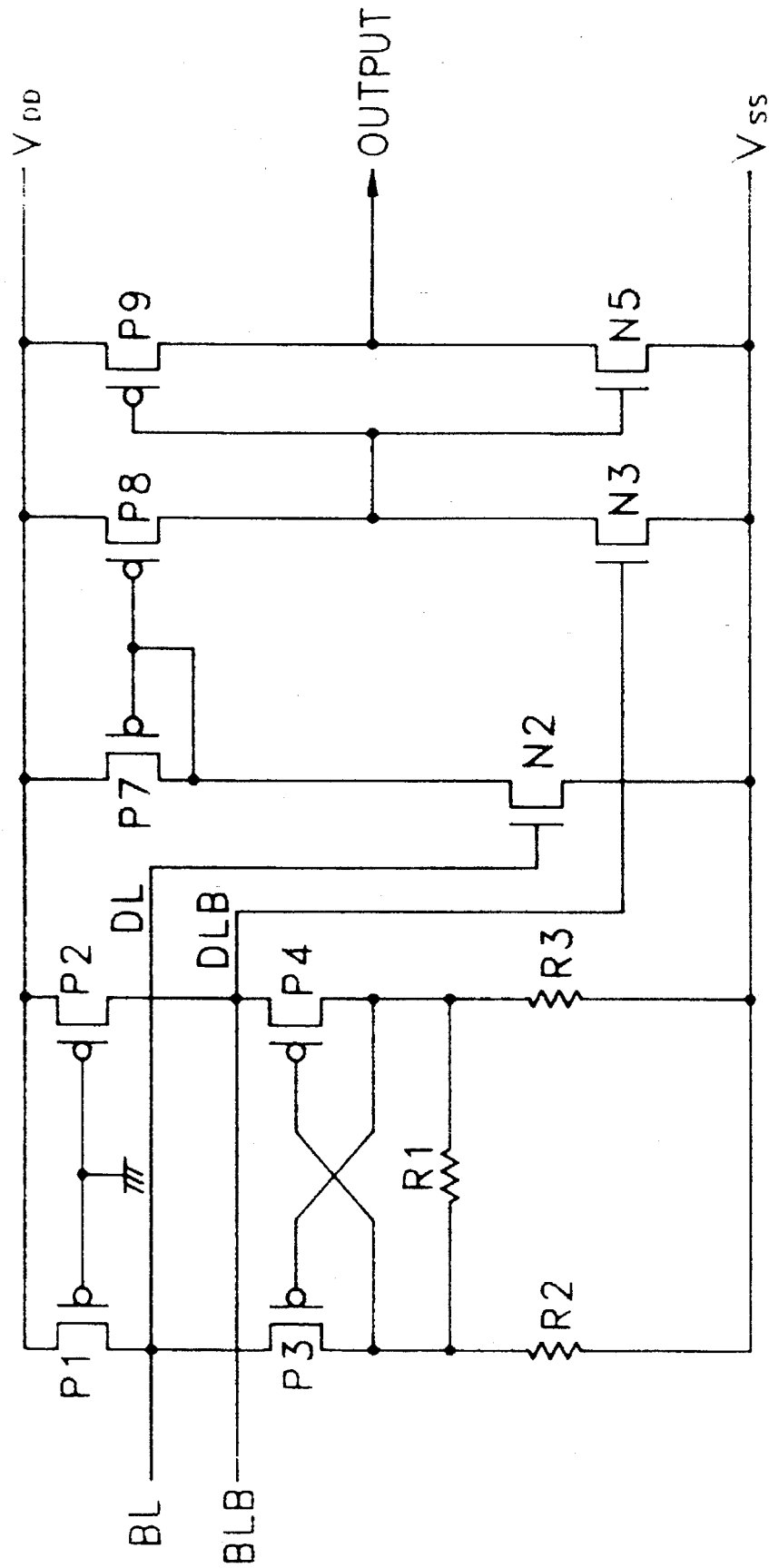
FIG. 3 is a circuit diagram of semiconductor memory device constructed in accordance with a first preferred embodiment of the present invention.

With reference now to FIG. 3, a first preferred embodiment of the semiconductor memory device of the present invention will now be described. More particularly, the semiconductor memory device of this embodiment includes a PMOS transistor P1 whose source electrode is connected to a bit line BL/data line DL, a PMOS transistor P2 whose gate electrode is connected to the gate electrode of the PMOS transistor P1, whose source electrode is connected to the source electrode of the PMOS transistor P1, and whose source electrode is connected to the inverted bit line BLB/inverted data line DLB. The source electrodes of the PMOS transistors P1 and P2 are commonly coupled to a power supply voltage ($V_{DD}$).

The memory device of this embodiment further includes a PMOS transistor P3 whose source electrode is connected to the drain electrode of the PMOS transistor P1, a PMOS transistor P4 whose source electrode is connected to the drain electrode of the PMOS transistor P2, whose gate electrode is connected to the drain electrode of the PMOS transistor P3, and whose drain electrode is connected to the gate electrode of the PMOS transistor P3. The drain electrode of the PMOS transistor P3 is connected to the gate electrode of the PMOS transistor P4. Thus, the PMOS transistors P3 and P4 are cross-coupled. A resistor R1 is connected between the drain electrodes of the PMOS transistors P3 and P4. A resistor R2 is connected between the drain electrode of the PMOS transistor P3 and a reference potential ($V_{SS}$), e.g., ground. A resistor R3 is connected between the drain electrode of the PMOS transistor P4 and $V_{SS}$ (hereinafter referred to as ground). The memory device of this embodiment also includes PMOS transistors P7, P8, and P9, and NMOS transistors N2, N3, and N5, configured as shown in FIG. 3.

The PMOS transistors P1 and P2 operate as constant current sources. The PMOS transistors s P3, P4, and the resistors R1, R2, R3 operate as a first stage sense amplifier. The PMOS transistors P7, P8, and the NMOS transistors N2, N3 operate as a second stage sense amplifier. The PMOS transistor P9 and the NMOS transistor N5 operate as a data output buffer/inverter.

Figure 4:
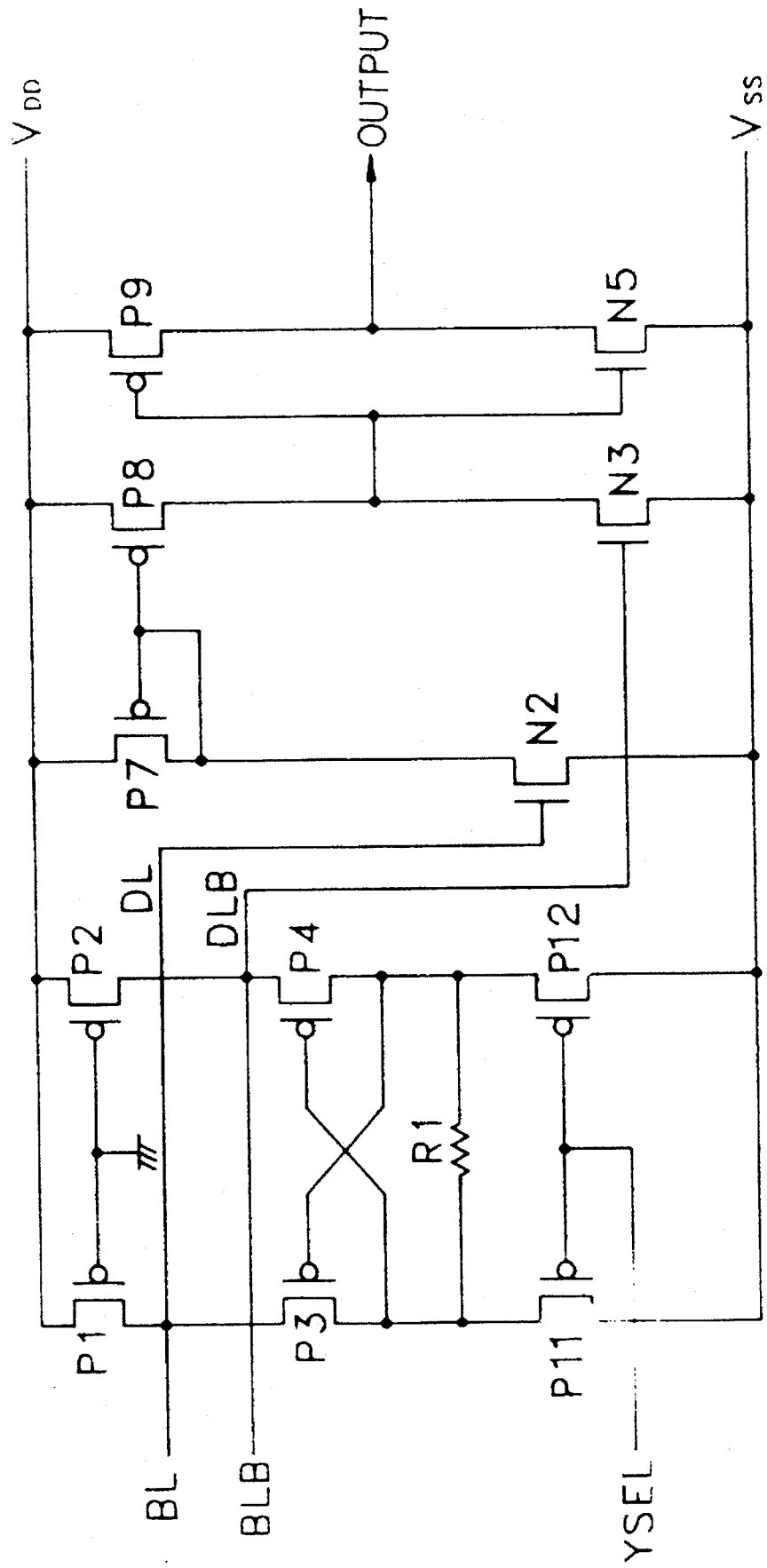
FIG. 4 is a circuit diagram of semiconductor memory device constructed in accordance with a second preferred embodiment of the present invention.

FIG. 4 is a circuit diagram of a second preferred embodiment of the semiconductor memory device of the present invention. This embodiment differs from that shown in FIG. 3, in the following respects only. Namely, PMOS transistors P11 and P12 are substituted for the resistors R2 and R3, and a select signal YSEL is connected to the commonly coupled gates of the PMOS transistors P11 and P12.

Figure 5:
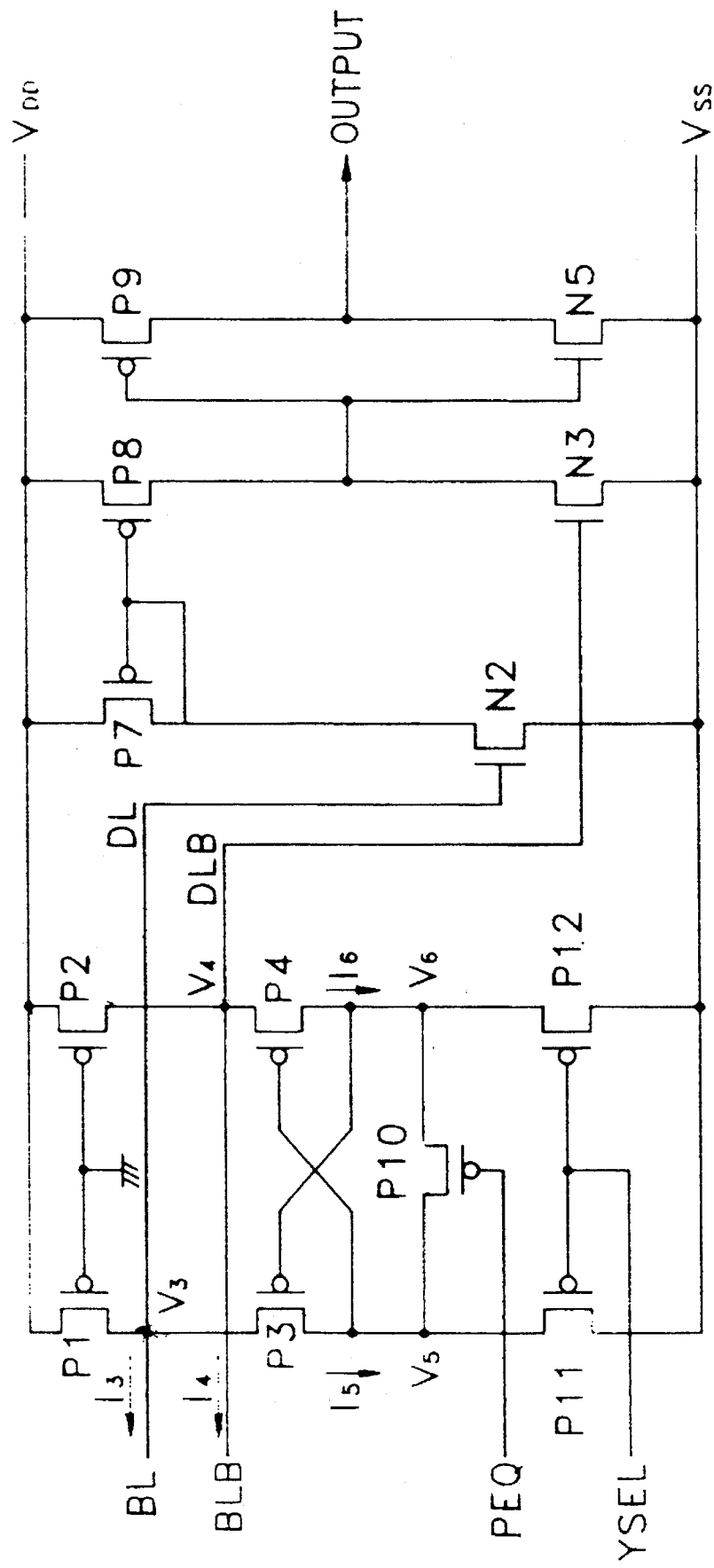
FIG. 5 is a circuit diagram of semiconductor memory device constructed in accordance with a third preferred embodiment of the present invention.

FIG. 5 is a circuit diagram of a third preferred embodiment of the semiconductor memory device of the present invention. This embodiment differs from that shown in FIG. 4, in the following respects only. Namely, a PMOS transistor P10 is substituted for the resistor R1, and a signal PEQ is applied to the gate electrode of the PMOS transistor P10.

Figure 6:
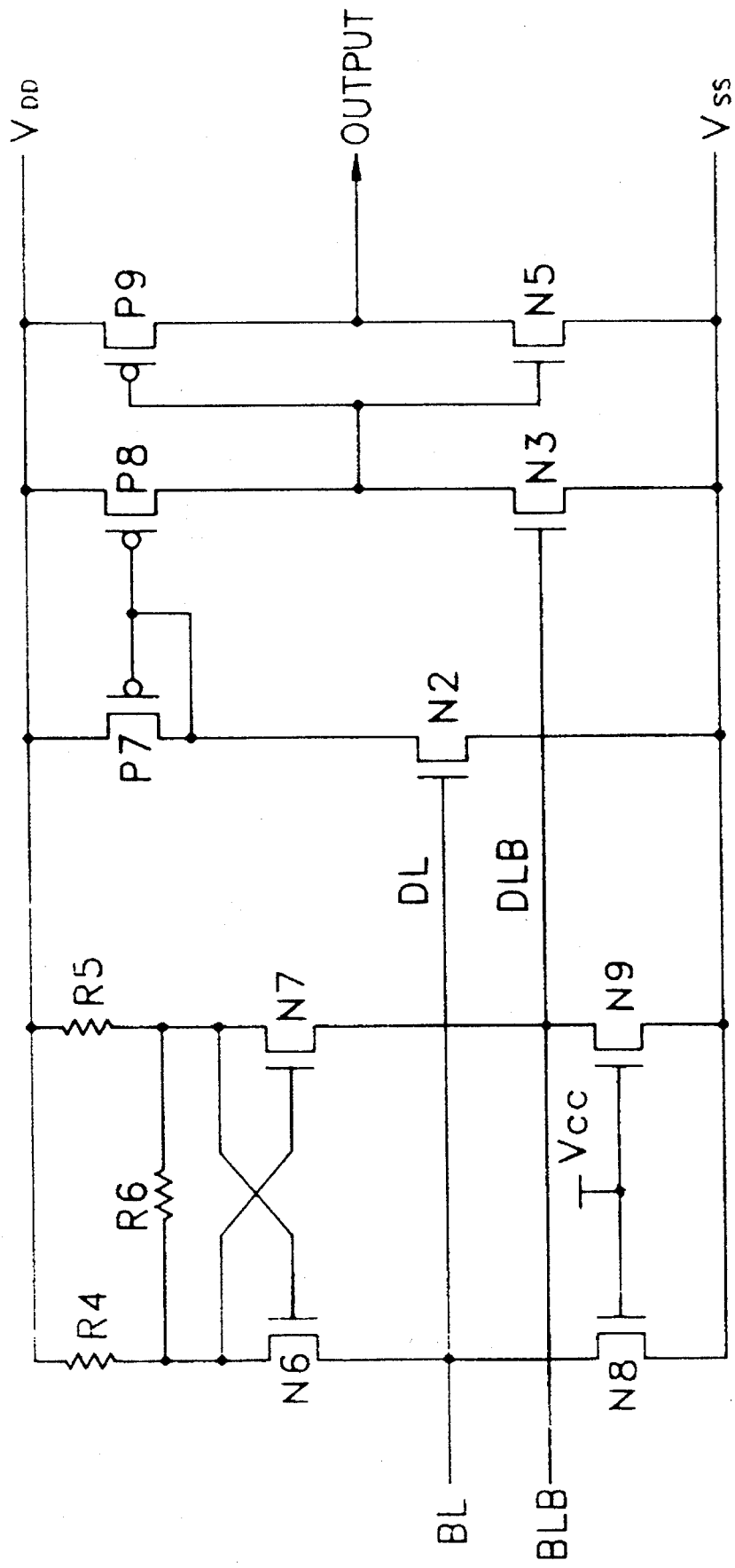
FIG. 6 is a circuit diagram of semiconductor memory device constructed in accordance with a fourth preferred embodiment of the present invention.

With reference now to FIG. 6, a fourth preferred embodiment of the semiconductor memory device of the present invention will now be described. More particularly, the semiconductor memory device of this embodiment includes resistors R4 and R5 whose first ends are connected to one another and are commonly coupled to the power supply voltage ($V_{DD}$). A resistor R6 is connected between the second ends of the resistors R4 and R5. The memory device of this embodiment also includes cross-coupled NMOS transistors N6 and N7. The drain electrode of the NMOS transistor N6 is connected to the second end of the resistor R4 and to the gate electrode of the NMOS transistor N7. The drain electrode of the NMOS transistor N7 is connected to the second end of the resistor R5 and to the gate electrode of the NMOS transistor N6. The source electrode of the NMOS transistor N6 is connected to the bit line BL/data line DL, and the source electrode of the NMOS transistor N7 is connected to the inverted bit line BLB/inverted data line DLB.

The memory device of this embodiment further includes NMOS transistors N8 and N9 whose gate electrodes are connected to each other and are commonly coupled to power supply voltage ($V_{CC}$), and whose source electrodes are connected to each other and are commonly coupled to ground. The drain electrode of the NMOS transistor N8 is connected to the source electrode of the NMOS transistor N6, and the drain electrode of the NMOS transistor N9 is connected to the source electrode of the NMOS transistor N7. The memory device of this embodiment also includes the PMOS transistors P7, P8, P9, and the NMOS transistors N2, N3, N5 configured as shown in FIG. 6.

The NMOS transistors N8 and N9 operate as constant current sources. The NMOS transistors N6, N7, and the resistors R4, R5, R6, operate as a first stage sense amplifier. The PMOS transistors P7, P8, and the NMOS transistors N2, N3, operate as a second stage sense amplifier. The PMOS transistor P9 and the NMOS transistor N5 operate as a data output buffer/inverter.

Figure 7:
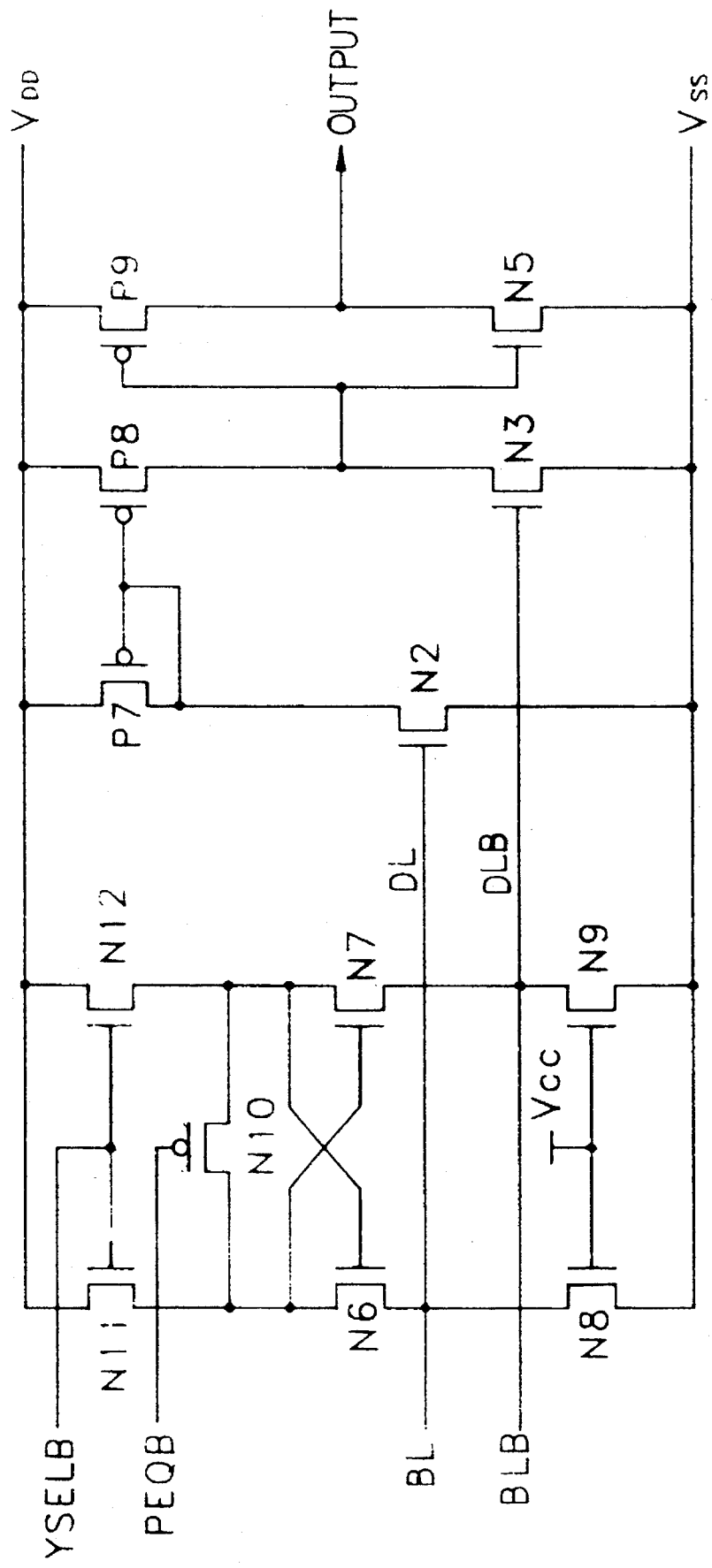
FIG. 7 is a circuit diagram of semiconductor memory device constructed in accordance with a fifth preferred embodiment of the present invention.

FIG. 7 is a circuit diagram of a fifth preferred embodiment of the semiconductor memory device of the present invention. This embodiment differs from that shown in FIG. 6, in the following respects only. Namely, NMOS transistors N11 and N12 are substituted for the resistors R4 and R5, respectively. The gate electrodes of the NMOS transistors N11 and N12 are connected to each other and are commonly coupled to an inverted select signal YSELB. An NMOS transistor N10 is substituted for the resistor R6. A signal PEQB is applied to the gate electrode of the NMOS transistor N10.

Figure 8:
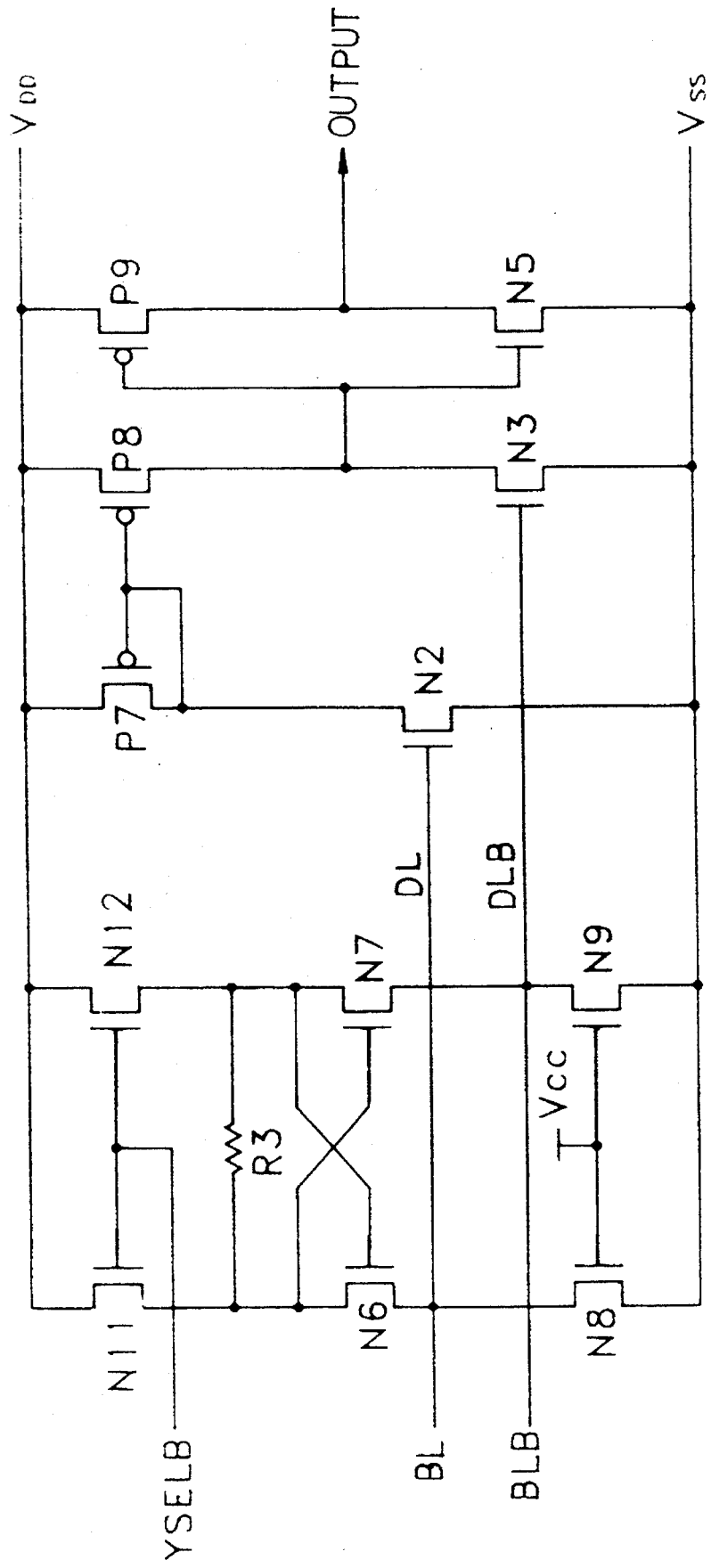
FIG. 8 is a circuit diagram of semiconductor memory device constructed in accordance with a sixth preferred embodiment of the present invention.
Figure 9:
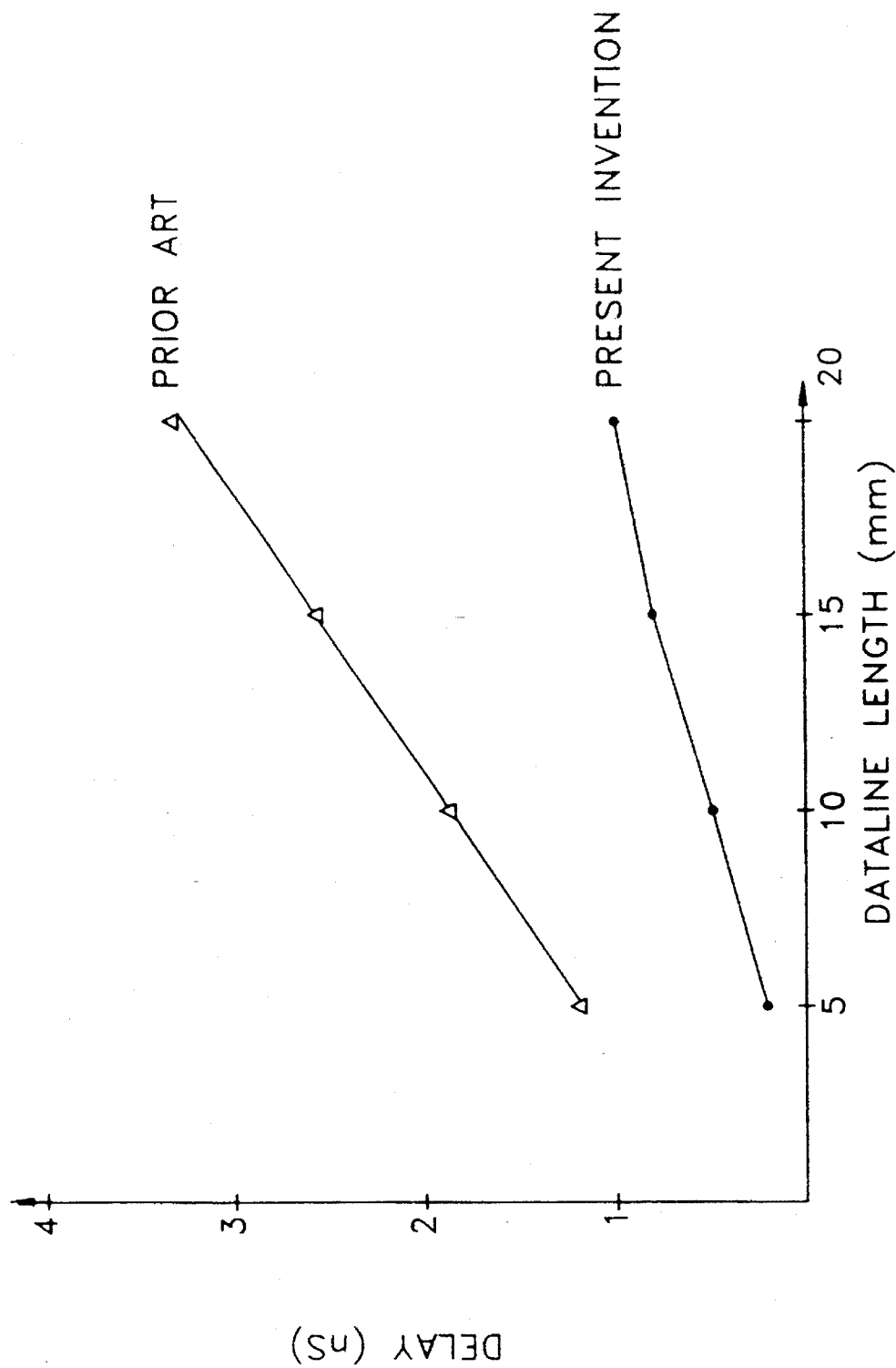
FIG. 9 is an graph depicting signal delay versus dataline length for a prior art semiconductor memory device and for the semiconductor memory device of the present invention, based on computer simulations of the operation of the semiconductor memory device of the present invention and that of the prior art semiconductor memory device; and, FIG. 10 is a graph comparing the operational speed of the semiconductor memory device of the present invention and that of a prior art semiconductor memory device.
Figure 10:
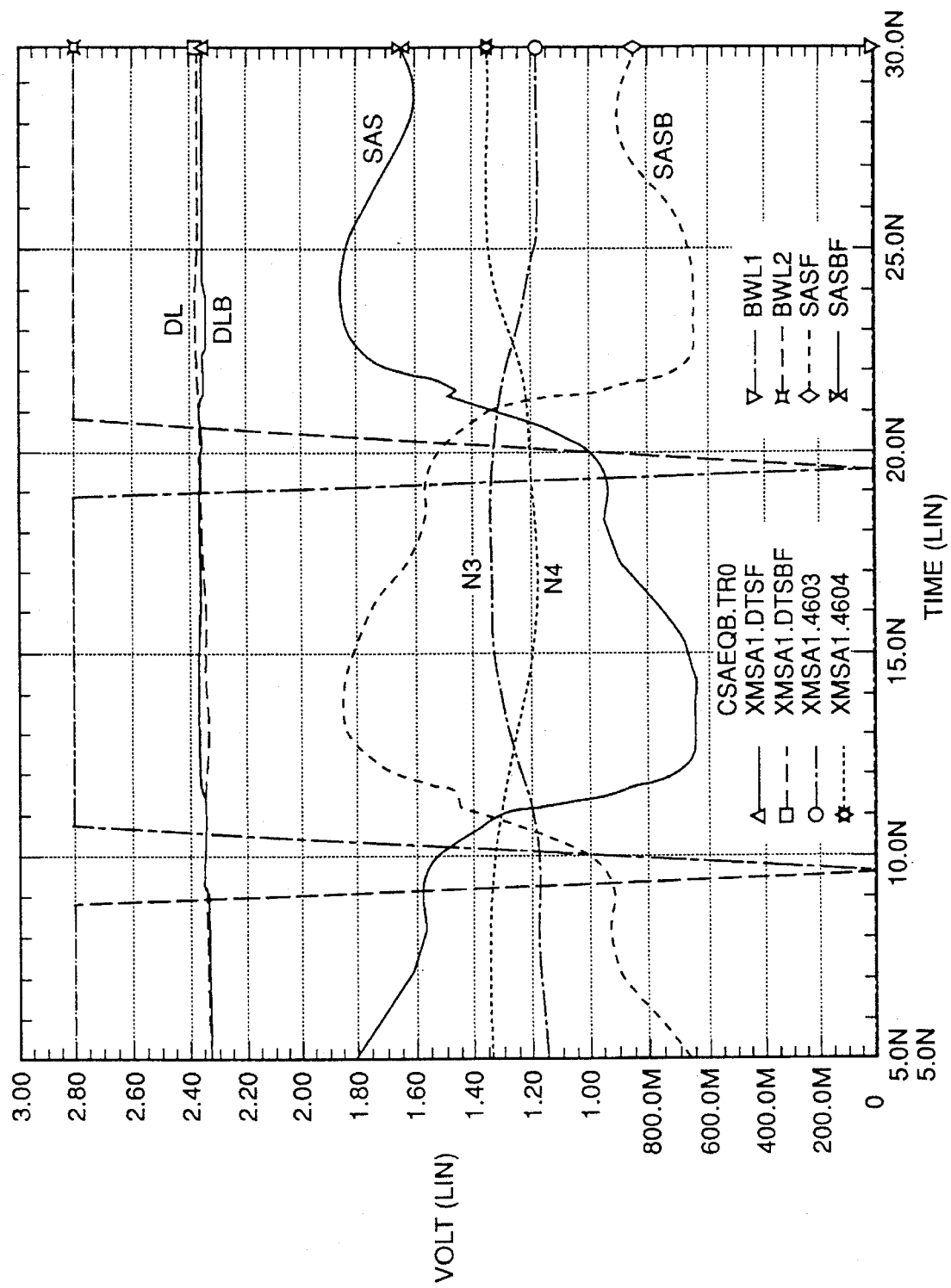

FIG. 8 is a circuit diagram of a sixth preferred embodiment of the semiconductor memory device of the present invention. This embodiment differs from that shown in FIG. 7, in the following respects only. Namely, a resistor R3 is substituted for the NMOS transistor N10.

The operation of the semiconductor memory device of the present invention will now be described in connection with the embodiment depicted in FIG. 5, with the understanding that the principles of operation with respect to all other embodiments of the present invention are analogous thereto.

With reference to FIG. 5, during a read operation, data stored in a selected memory cell (not shown) connected between the complementary bit lines BL, BLB is read out from the selected memory cell, via the bit line pair BL, BLB. Assuming a binary "1" is stored in the selected memory cell, the voltage on the bit line BL is raised to a "high" level, and the voltage on the inverted bit line BLB is lowered to a "low" level. When a signal Y becomes "high" and a signal YB becomes "low", the bit line and inverted bit line voltages are held at their "high" and "low" levels, respectively. The current $l_4=l_3+\Delta l$, and the current $l_6=l_5-\Delta l$. Therefore, the voltage $V_5$ is driven to a "high" level and the voltage $V_6$ is driven to a "low" level. Now, assuming, during the next read cycle, that a binary "0" is read from the selected memory cell, thereby inverting the voltages $V_3$ and $V_4$. Then, the current $l_4$ changes from $l_3+\Delta l$ to $(l_3+\Delta l) -\Delta i$, where $\Delta i$ is less than $\Delta l$. Also, the current $l_5$ changes to $l_5-\Delta i$, and the current $l_6$ changes to $l_5-\Delta l + \Delta i$. However, even this slight change in current is sufficient to quickly raise the voltage $V_4$ to a "high" level, and to lower the voltage $V_3$ to a "low" level, due to the low impedance state of the PMOS transistor P3 and the high impedance state of the PMOS transistor P4, thus increasing the speed of operation of the semiconductor memory device.

Although several preferred embodiments of the present invention have been described in detail hereinabove, it should be clearly understood that many variations and/or modifications of the basic inventive concepts herein taught which may appear to those skilled in the pertinent art will still fall within the spirit and scope of the present invention as defined in the appended claims. For example, some or all of the PMOS transistors can be replaced by PNP bipolar transistors, and/or some or all of the NMOS transistors can be replaced by NPN bipolar transistors.

What is claimed is:

1. A semiconductor memory device, comprising:

a first PMOS transistor having a source electrode coupled to a signal transport line;

a second PMOS transistor having a source electrode coupled to an inverted signal transport line, a drain electrode coupled to a gate electrode of said first PMOS transistor, and a gate electrode coupled to a drain electrode of said first PMOS transistor;

a first current limiter connected between said drain electrode of said first PMOS transistor and a reference potential;

a second current limiter connected between said drain electrode of said second PMOS transistor and said reference potential;

a first constant current source connected between a supply voltage and said source electrode of said first PMOS transistor; and, a second constant current source connected between said supply voltage and said source electrode of said second PMOS transistor.

2. A semiconductor memory device as set forth in claim 1, further comprising a third current limiter connected between said drain electrode of said first PMOS transistor and said drain electrode of said second PMOS transistor.

3. The semiconductor memory device as set forth in claim 2, wherein said third current limiter comprises a third PMOS transistor having a first electrode coupled to said drain electrode of said first PMOS transistor, a second electrode coupled to said drain electrode of said second PMOS transistor, and a gate electrode coupled to a first control signal.

4. The semiconductor memory device as set forth in claim 2, wherein said third current limiter comprises a resistor.

5. The semiconductor memory device as set forth in claim 1, wherein said first current limiter comprises a first resistor, and said second current limiter comprises a second resistor.

6. The semiconductor memory device as set forth in claim 3, wherein:

said first current limiter comprises a fourth PMOS transistor having a source electrode coupled to said drain electrode of said first PMOS transistor, a drain electrode coupled to said reference potential, and a gate electrode coupled to a second control signal; and, said second current limiter comprises a fifth PMOS transistor having a source electrode coupled to said drain electrode of said second PMOS transistor, a drain electrode coupled to said reference potential, and a gate electrode coupled to said second control signal, and to said gate electrode of said fourth PMOS transistor.

7. The semiconductor memory device as set forth in claim 1, further comprising:

a third PMOS transistor having a source electrode coupled to said supply voltage, a gate electrode, and a drain electrode coupled to said gate electrode;

a fourth PMOS transistor having a source electrode coupled to said supply voltage, a gate electrode coupled to said gate electrode of said third PMOS transistor, and a drain electrode;

a first NMOS transistor having a drain electrode coupled to said drain electrode of said third PMOS transistor, a source electrode coupled to said reference potential, and a gate electrode coupled to said signal transport line; and, a second NMOS transistor having a drain electrode coupled to said drain electrode of said fourth PMOS transistor, a source electrode coupled to said reference potential, and a gate electrode coupled to said inverted signal transport line.

8. The semiconductor memory device as set forth in claim 7, further comprising:

a fifth PMOS transistor having a source electrode coupled to said supply voltage, a gate electrode coupled to an intermediate node between, said drain electrode of said fourth PMOS transistor and said drain electrode of said second NMOS transistor, and a drain electrode;

a third NMOS transistor having a drain electrode coupled to said drain electrode of said fifth PMOS transistor, a source electrode coupled to said reference potential, and a gate electrode coupled to said intermediate node; and, an output node between said drain electrode of said fifth PMOS transistor and said drain electrode of said third NMOS transistor.

9. A semiconductor memory device, comprising:

a first PNP transistor having an emitter coupled to a signal transport line, a base, and a collector;

a second PNP transistor having an emitter coupled to an inverted signal transport line, a collector coupled to said base of said first PNP transistor, and a base coupled to said collector of said first PNP transistor;

a first current limiter connected between said collector of said first PNP transistor and a reference potential;

a second current limiter connected between said collector of said second PNP transistor and said reference potential;

a first constant current source connected between a supply voltage and said emitter of said first PNP transistor; and, a second constant current source connected between said supply voltage and said emitter of said second PNP transistor.

10. The semiconductor memory device as set forth in claim 9, further comprising a third current limiter connected between said collector of said first PNP transistor and said collector of said second PNP transistor.

11. The semiconductor memory device as set forth in claim 10, wherein said third current limiter comprises a third PNP transistor having an emitter coupled to said collector of said first PNP transistor, a collector coupled to said collector of said second PNP transistor, and a base coupled to a first control signal.

12. The semiconductor memory device as set forth in claim 10, wherein said third current limiter is a resistor having a first end coupled to said collector of said first PNP transistor, and a second end coupled to said collector of said second PNP transistor.

13. The semiconductor memory as set forth in claim 9, wherein said first current limiter comprises a first resistor, and said second current limiter comprises a second resistor.

14. The semiconductor memory device as set forth in claim 11, wherein:

said first current limiter comprises a fourth PNP transistor having an emitter coupled to said collector of said first PNP transistor, a collector coupled to said reference potential, and a base coupled to a second control signal; and, said second current limiter comprises a fifth PNP transistor having an emitter coupled to said collector of said second PNP transistor, a collector coupled to said reference potential, and a base coupled to said second control signal, and to said base of said fourth PNP transistor.

15. The semiconductor memory device as set forth in claim 9, wherein said signal transport line comprises a data line, and said inverted signal transport line comprises an inverted data line.

16. The semiconductor memory device as set forth in claim 9, wherein said signal transport line comprises a bit line, and said inverted signal transport line comprises an inverted bit line.

17. A semiconductor memory device, comprising:

a first current limiter coupled to a supply voltage;

a second current limiter coupled to said supply voltage;

a first NMOS transistor having a drain electrode coupled to said first current limiter, a gate electrode coupled to said second current limiter, and a source electrode coupled to a signal transport line;

second NMOS transistor having a drain electrode coupled to said gate electrode of said first NMOS transistor and to said second current limiter, a gate electrode coupled to said drain electrode of said first NMOS transistor and to said first current limiter, and a source electrode coupled to an inverted signal transport line;

a first constant current source connected between said source electrode of said first NMOS transistor and a reference potential; and, a second constant current source connected between said source electrode of said second NMOS transistor and said reference potential.

18. The semiconductor memory device as set forth in claim 17, further comprising a third current limiter connected between said drain electrode of said first NMOS transistor and said drain electrode of said second NMOS transistor.

19. The semiconductor memory device as set forth in claim 18, wherein said third current limiter comprises a third NMOS transistor having a first electrode coupled to said drain electrode of said first NMOS transistor, a second electrode coupled to said drain electrode of said second NMOS transistor, and a gate electrode coupled to a first control signal.

20. The semiconductor memory device as set forth in claim 17, wherein said first current limiter comprises a first resistor, and said second current limiter comprises a second resistor.

21. The semiconductor memory device as set forth in claim 18, wherein said third current limiter comprises a resistor having a first end coupled to said drain electrode of said first NMOS transistor, and a second end coupled to said drain electrode of said second NMOS transistor.

22. The semiconductor memory device as set forth in claim 19, wherein:

said first current limiter comprises a fourth NMOS transistor having a drain electrode coupled to said source electrode of said first NMOS transistor, a source electrode coupled to said reference potential, and a gate electrode coupled to a second control signal; and, said second current limiter comprises a fifth NMOS transistor having a drain electrode coupled to said source electrode of said second NMOS transistor, a source electrode coupled to said reference potential, and a gate electrode coupled to said second control signal, and to said gate electrode of said fourth NMOS transistor.

23. A semiconductor memory device, comprising:

a first current limiter coupled to a supply voltage;

a second current limiter coupled to said supply voltage;

a first NPN transistor having a collector coupled to said first current limiter, a base coupled to said second current limiter, and an emitter coupled to a signal transport line;

a second NPN transistor having collector coupled to base of said first NPN transistor and to said second current limiter, a base coupled to said collector of said first NPN transistor and to said first current limiter, and an emitter coupled to an inverted signal transport line;

a first constant current source connected between said emitter of said first NPN transistor and a reference potential; and, a second constant current source connected between emitter of said second NPN transistor and said reference potential.

24. The semiconductor memory device as set forth in claim 23, further comprising a third current limiter connected between said collector of said first NPN transistor and said collector of said second NPN transistor.

25. The semiconductor memory device as set forth in claim 24, wherein said third current limiter comprises a third NPN transistor having a first electrode coupled to said collector of said first NPN transistor, a second electrode coupled to said collector of said second NPN transistor, and a base coupled to a first control signal.

26. The semiconductor memory device as set forth in claim 23, wherein said first current limiter comprises a first resistor, and said second current limiter comprises a second resistor.

27. The semiconductor memory device as set forth in claim 24, wherein said third current limiter comprises a resistor having a first end coupled to said collector of said first NPN transistor, and a second end coupled to said collector of said second NPN transistor.

28. The semiconductor memory device as set forth in claim 25, wherein:

said first current limiter comprises a fourth NPN transistor having a collector coupled to said emitter of said first NPN transistor, an emitter coupled to said reference potential, and a base coupled to a second control signal; and, said second current limiter comprises a fifth NPN transistor having a collector coupled to said emitter of said second NPN transistor, an emitter coupled to said reference potential, and a base coupled to said second control signal, and to said base of said fourth NPN transistor.

* * * * *